(12) United States Patent
Greim

(10) Patent No.: US 6,552,546 B2
(45) Date of Patent: Apr. 22, 2003

(54) INDUCTIVELY COUPLED RECEPTION COIL ARRANGEMENT FOR MAGNETIC RESONANCE TOMOGRAPHY

(75) Inventor: Helmut Greim, Adelsdorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/977,766

(22) Filed: Oct. 15, 2001

(65) Prior Publication Data

US 2002/0060568 A1 May 23, 2002

(30) Foreign Application Priority Data

Oct. 13, 2000 (DE) .......................................... 100 50 725

(51) Int. Cl.$^7$ ................................................ G01V 3/00
(52) U.S. Cl. ........................................ 324/318; 324/309
(58) Field of Search ................................ 324/318, 309, 324/312, 322; 600/410, 421, 422

(56) References Cited

U.S. PATENT DOCUMENTS

| | | | | |
|---|---|---|---|---|
| 4,649,345 A | * | 3/1987 | Flugan | 324/318 |
| 4,825,162 A | * | 4/1989 | Roemer et al. | 324/318 |
| 4,885,541 A | | 12/1989 | Hayes | |
| 5,243,287 A | * | 9/1993 | Hashoian et al. | 324/318 |
| 5,565,779 A | * | 10/1996 | Arakawa et al. | 324/318 |
| 6,157,193 A | | 12/2000 | Renz et al. | |
| 6,177,796 B1 | * | 1/2001 | Viti | 324/314 |
| 6,198,962 B1 | * | 3/2001 | Su | 600/422 |
| 6,236,206 B1 | * | 5/2001 | Hartman et al. | 324/318 |

* cited by examiner

Primary Examiner—Edward Lefkowitz
Assistant Examiner—Brij B. Shrivastav
(74) Attorney, Agent, or Firm—Schiff Hardin & Waite

(57) ABSTRACT

An inductively coupled reception coil arrangement for magnetic resonance tomography, having at least two inter-nested individual coils, the outer primary coil of which serves as output coil for the inner secondary coil. The primary coil has a pre-amplifier decoupling device which closes it with high resistance.

3 Claims, 1 Drawing Sheet

INDUCTIVELY COUPLED RECEPTION COIL ARRANGEMENT FOR MAGNETIC RESONANCE TOMOGRAPHY

BACKGROUND OF THE INVENTION

1. Field of the Invention

The present invention relates to an inductively coupled reception coil arrangement for magnetic resonance tomography having at least two individual coils, including an outer primary coil serving as the output coil for an inner secondary coil.

2. Description of the Prior Art

In magnetic resonance tomography, local coils are employed for imaging different body parts, the local coils being specifically adapted by means of their geometry and their receiving profile, since it is important to have a high sensitivity factor of the coil for the purpose of achieving a high signal-to-noise ratio. This means that the volume of the coil and the sample should be the same size as far as possible. Consequently, use is made in practice of coils of different sizes for head, knee and wrist.

It is also known to introduce a second, smaller coil into a larger coil, the two coils being coupled inductively, since it is possible in this way to improve the sensitivity factor.

New oscillation modes arise, however, in the case of inter-nesting of two coils. The coils influence one another mutually such that the receiving coil must be re-tuned in each case, or the receiving coil is used only as output coil and does not itself contribute to imaging. Specifically in the case of circular coils, re-tuning is very complicated because of the additional coupling of the linear systems.

SUMMARY OF THE INVENTION

It is an object of the present invention to configure an inductively coupled reception coil arrangement of the type initially described so as to avoid undesired mutual influencing of the coils, and thus to avoid the need for re-tuning.

This object is achieved in accordance with the invention by providing the primary coil with a pre-amplifier decoupling device which closes the coil with high resistance. In an embodiment the pre-amplifier decoupling device has an input impedance of the pre-amplifier such that, together with an interface circuit, it constitutes a parallel resonance point at the low end of the coil.

Such a coil with pre-amplifier decoupling no longer has a resonance point, and so the inductively coupled coil (secondary coil) remains at resonance when introduced into the output coil (primary coil), there being only a slight influence on the unloaded Q of the secondary coil. This is greatly advantageous in the case of a circular design, in particular.

A further advantage of the design according to the invention with a high-resistance closure of the primary coil via a pre-amplified decoupling is that the primary coil can be used both as an imaging receiving coil alone or as output coil for the secondary coil.

It is possible to dispense entirely with load-dependent re-tuning by means of a low-noise design of the pre-amplifier.

DESCRIPTION OF THE PREFERRED EMBODIMENTS

The primary coil 1, which constitutes a head coil, for example, is decoupled by low-noise pre-amplifiers 3, and need not be tuned. It can be used solely for imaging. Owing to a cylindrical design, the head coil 1 surrounds the corresponding body part completely (for example, head or extremities).

The secondary coil 2 (for example, the wrist coil) can optionally be introduced into the primary coil 1 without the need for renewed adjustment. The linear systems are orthogonal to one another for both coils, with passive de-tuning circuits 4 and 5 suppressing the resonance current in the secondary coil 2 in order not to disturb the exciting field during the transmitting mode.

Figure 1:
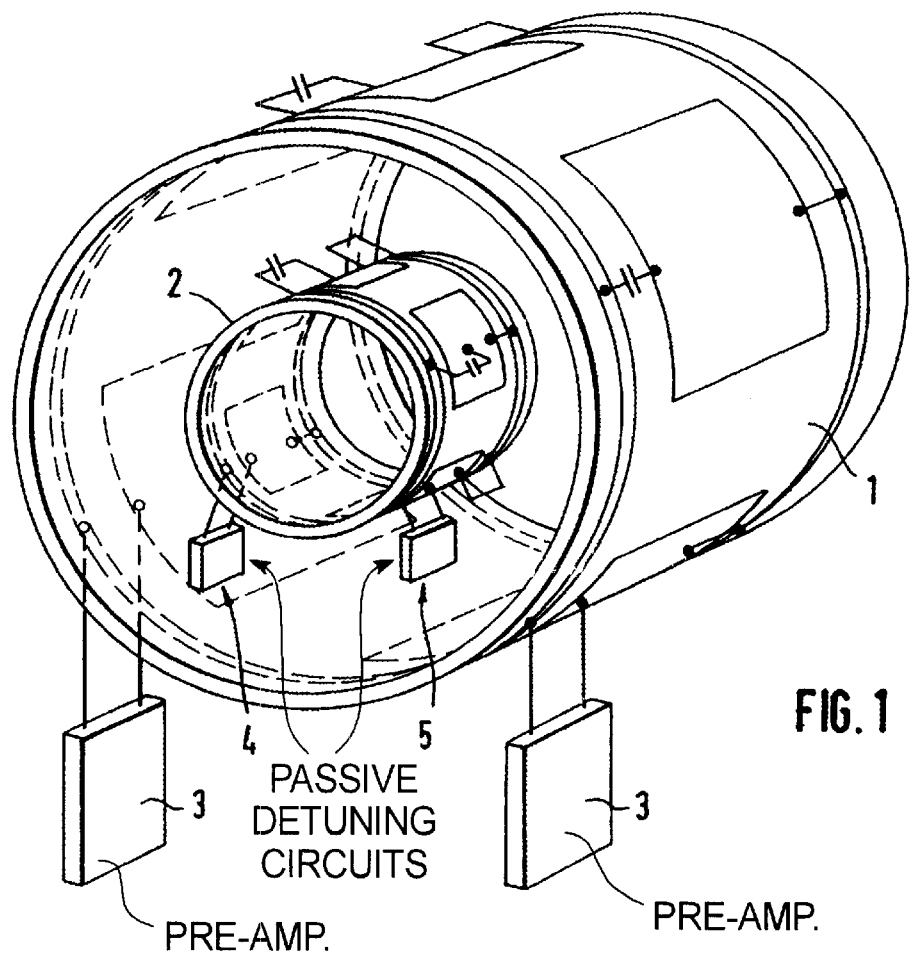
FIG. 1 shows a circular volumetric resonator (primary coil) into which a circular (hand coil (secondary coil) is coupled in accordance with the invention.
Figure 2:
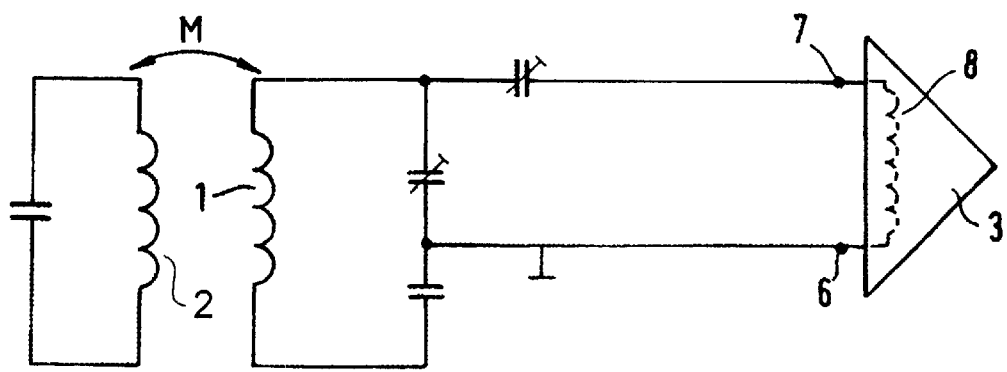
FIG. 2 shows a diagram of the primary coil circuit in accordance with the invention.

FIG. 2 is a circuit schematic of the coil arrangement according to the invention with pre-amplifier decoupling, the circuit corresponds up to the terminal points 6 and 7 for the pre-amplifier 3 to the usual design of a reception coil, which is designed such that it has an output of 50 ohms. The pre-amplifier circuit acts like an inductor 8, the design being adapted such that together with the interface circuit, it constitutes a parallel resonance point at the low end of the primary coil 1.

The signal-to-noise ratio can be improved in a very simple way by more than a factor of two due to the design according to the invention.

Although modifications and changes may be suggested by those skilled in the art, it is the intention of the inventor to embody within the patent warranted hereon all changes and modifications as reasonably and properly come within the scope of his contribution to the art.

I claim as my invention:

1. An inductively coupled reception coil arrangement for magnetic resonance tomography, comprising at least two inter-nested individual volume coils, including an outer primary volume coil and an inner secondary volume coil, the outer primary volume coil serving as an output coil for the inner secondary volume coil, said primary volume coil having a pre-amplifier decoupling device which closes the primary volume coil with high resistance.

2. The reception coil arrangement as claimed in claim 1, further comprising an interface circuit and wherein said pre-amplifier decoupling device has a pre-amplifier with input impedance selected for forming, together with the interface circuit, a parallel resonance point at a low end of the primary volume coil.

3. The reception coil arrangement as claimed in claim 2, wherein the pre-amplifier is of low-noise design.

* * * * *